(12) United States Patent
Dally et al.

(10) Patent No.: US 9,164,134 B2
(45) Date of Patent: Oct. 20, 2015

(54) HIGH-RESOLUTION PHASE DETECTOR

(71) Applicant: NVIDIA Corporation, Santa Clara, CA (US)

(72) Inventors: William J. Dally, Los Altos Hills, CA (US); Stephen G. Tell, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 252 days.

(21) Appl. No.: 13/676,021

(22) Filed: Nov. 13, 2012

(65) Prior Publication Data

US 2014/0132245 A1    May 15, 2014

(51) Int. Cl.
| | |
|---|---|
| G01R 29/00 | (2006.01) |
| H03D 3/00 | (2006.01) |
| H03D 9/00 | (2006.01) |
| G01R 25/00 | (2006.01) |

(52) U.S. Cl.
CPC ...................... *G01R 25/00* (2013.01)

(58) Field of Classification Search
USPC .................. 327/2, 12, 40, 236, 244
See application file for complete search history.

(56) References Cited

U.S. PATENT DOCUMENTS

| | | | |
|---|---|---|---|
| 4,295,106 A * | 10/1981 | Kahn ........................... 332/156 |
| 5,309,035 A | 5/1994 | Watson, Jr. et al. | |
| 5,511,100 A | 4/1996 | Lundberg et al. | |
| 5,694,377 A | 12/1997 | Kushnick | |
| 6,194,938 B1 | 2/2001 | Waldrop | |
| 6,219,305 B1 | 4/2001 | Patrie et al. | |
| 6,429,693 B1 * | 8/2002 | Staszewski et al. ............. 327/12 |
| 6,831,490 B1 | 12/2004 | Tan et al. | |
| 7,180,332 B2 | 2/2007 | Di Gregorio | |
| 7,304,510 B2 | 12/2007 | Matsuta | |
| 7,332,940 B2 | 2/2008 | Watanabe | |
| 7,333,151 B2 | 2/2008 | Ozawa | |
| 7,791,377 B2 | 9/2010 | Kim et al. | |
| 7,804,344 B2 | 9/2010 | Ma et al. | |
| 7,855,933 B2 | 12/2010 | Song et al. | |
| 7,999,531 B2 | 8/2011 | Ichiyama | |
| 8,018,258 B2 | 9/2011 | Ma et al. | |
| 8,098,085 B2 | 1/2012 | Wang et al. | |
| 8,155,236 B1 * | 4/2012 | Sidiropoulos et al. ........ 375/288 |
| 8,174,293 B2 * | 5/2012 | Yoshihara et al. ............ 327/107 |
| 8,415,983 B2 | 4/2013 | Tokairin | |

(Continued)

FOREIGN PATENT DOCUMENTS

| | | |
|---|---|---|
| TW | 442947 B | 6/2001 |
| TW | I309923 B | 5/2009 |
| TW | I361570 B | 4/2012 |

OTHER PUBLICATIONS

Dally, W. J. et al., "The Even/Odd Synchronizer: A Fast, All-Digital, Periodic Synchronizer," IEEE Symposium on Asynchronous Circuits and Systems, IEEE Computer Society, 2010, pp. 75-84.

(Continued)

*Primary Examiner* — Adam Houston
(74) *Attorney, Agent, or Firm* — Zilka-Kotab, PC

(57) ABSTRACT

A method and a system are provided for clock phase detection. A set of delayed versions of a first clock signal is generated. The set of delayed versions of the first clock is used to sample a second clock signal, producing a sequence of samples in a domain corresponding to the first clock signal. At least one edge indication is located within the sequence of samples.

20 Claims, 19 Drawing Sheets

(56) References Cited

U.S. PATENT DOCUMENTS

| | | | |
|---|---|---|---|
| 8,760,204 | B2 | 6/2014 | Dally et al. |
| 8,866,511 | B2 | 10/2014 | Dally |
| 2002/0158662 | A1* | 10/2002 | Staszewski et al. ............. 326/46 |
| 2002/0191727 | A1* | 12/2002 | Staszewski et al. ........... 375/376 |
| 2005/0195511 | A1 | 9/2005 | Sano et al. |
| 2006/0220694 | A1 | 10/2006 | Watanabe |
| 2007/0165760 | A1 | 7/2007 | Lee |
| 2008/0030509 | A1 | 2/2008 | Conroy et al. |
| 2008/0303570 | A1 | 12/2008 | Lee |
| 2009/0175116 | A1 | 7/2009 | Song et al. |
| 2009/0184742 | A1 | 7/2009 | Kris |
| 2010/0146320 | A1 | 6/2010 | Chen et al. |
| 2010/0321001 | A1* | 12/2010 | Ichiyama ................... 324/76.77 |
| 2011/0064176 | A1 | 3/2011 | Takada |
| 2011/0102220 | A1* | 5/2011 | Nam et al. .................... 341/122 |
| 2011/0148490 | A1* | 6/2011 | Lee et al. ...................... 327/159 |
| 2011/0148676 | A1* | 6/2011 | Waheed et al. ............... 341/131 |
| 2011/0163787 | A1* | 7/2011 | Wan .............................. 327/158 |
| 2011/0243200 | A1* | 10/2011 | Kargl et al. ................... 375/219 |
| 2012/0069884 | A1* | 3/2012 | Sakurai .......................... 375/224 |
| 2012/0303996 | A1 | 11/2012 | Bauernfeind |
| 2012/0306893 | A1 | 12/2012 | Liu et al. |
| 2012/0319883 | A1* | 12/2012 | Cao et al. ...................... 341/155 |
| 2013/0121094 | A1* | 5/2013 | Zerbe et al. ................... 365/194 |
| 2013/0343441 | A1 | 12/2013 | Alfieri |
| 2014/0062553 | A1* | 3/2014 | Shim ............................. 327/158 |
| 2014/0064744 | A1* | 3/2014 | Yoshiyama et al. .......... 398/202 |
| 2014/0118030 | A1* | 5/2014 | Cheng et al. ................... 327/91 |
| 2014/0133613 | A1* | 5/2014 | Kumar et al. ................. 375/354 |
| 2014/0139175 | A1 | 5/2014 | Gonzalez |
| 2014/0139275 | A1 | 5/2014 | Dally et al. |
| 2014/0139276 | A1 | 5/2014 | Dally |
| 2014/0149780 | A1 | 5/2014 | Dally et al. |
| 2014/0266336 | A1* | 9/2014 | Islam et al. ................... 327/149 |
| 2014/0266353 | A1* | 9/2014 | Tang et al. .................... 327/159 |

OTHER PUBLICATIONS

Daily et al., U.S. Appl. No. 12/957,262, filed Nov. 30, 2010.
Office Action from Taiwan Patent Application No. 102137268, dated Sep. 25, 2014.
Notice of Allowance from U.S. Appl. No. 13/681,929, dated Feb. 10, 2014.
Non-Final Office Action from U.S. Appl. No. 13/681,929, dated Oct. 4, 2013.
Non-Final Office Action from U.S. Appl. No. 13/688,170, dated Jan. 2, 2015.
Dally, W. et al., "The Even/Odd Synchronizer: A Fast, All Digital Periodic Synchronizer", 2010 IEEE, pp. 75-84.
Notice of Allowance from U.S. Appl. No. 13/688,175, dated Aug. 8, 2014.
Non-Final Office Action from U.S. Appl. No. 13/688,175, dated Apr. 3, 2014.
Dally, W. J. et al., U.S. Appl. No. 12/957,262, filed Nov. 30, 2010.
Dally, W. J. et al., U.S. Appl. No. 13/688,170, filed Nov. 28, 2012.
Dally, W. J., U.S. Appl. No. 13/688,175, filed Nov. 28, 2012.
Dally, W. J. et al., U.S. Appl. No. 13/681,929, filed Nov. 20, 2012.
Office Action from Taiwan Patent Application No. 102137452, dated Mar. 13, 2015.
Office Action from Taiwan Patent Application No. 102139649, dated Jun. 4, 2015.

\* cited by examiner

HIGH-RESOLUTION PHASE DETECTOR

FIELD OF THE INVENTION

The present invention relates to circuits, and, more specifically to clock phase detection.

BACKGROUND

Many digital systems have multiple clock domains. Thus, when signals move from one clock domain to another, they must be synchronized to avoid metastability and synchronization failure. If the two clocks have fixed frequencies, the phase relationship between the two clocks is periodic, at the beat frequency of the two clocks. By taking advantage of this periodic phase relationship, aperiodic synchronizer can be simpler, have lower latency, and a lower probability of failure than a synchronizer that has to handle crossing clock domains where at least one of the clocks operates at a variable frequency.

When at least one of the clocks operates at a variable frequency, the design of the synchronizer is more complicated. Typically, signals passing between clock domains are synchronized with a periodic clock using asynchronous first-in, first-outs (FIFOs). A significant area overhead is incurred for the FIFO memory. The FIFOs also add several cycles of delay as the Gray-coded input and output pointers of the FIFO must be synchronized through multiple flip-flops to reliably transmit the signals across clock domains.

There is thus a need for addressing these and/or other issues associated with the prior art.

SUMMARY

A method and a system are provided for clock phase detection. A set of delayed versions of a first clock signal is generated. The set of delayed versions of the first clock is used to sample a second clock signal, producing a sequence of second clock samples in a domain corresponding to the first clock signal. At least one edge indication is located within the sequence of second clock samples.

DETAILED DESCRIPTION

Figure 1A:
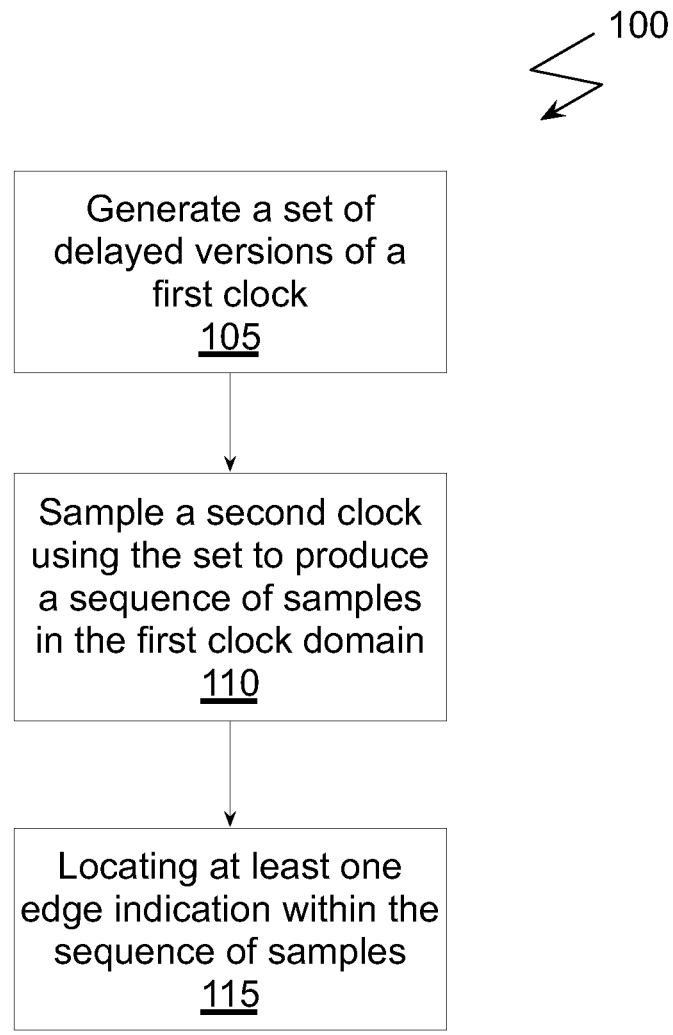
FIG. 1A illustrates a flowchart of a method for locating an edge indication within a sequence of clock signal samples, in accordance with one embodiment.

Processors used in smartphones, tablets, laptops, and other mobile devices sometimes reduce the supply voltage provided to one or more integrated circuit devices to reduce power consumption and extend the time between battery recharging. The integrated circuit devices may also vary the power supply voltage levels to different circuits within the device based on different operating modes. As a power supply voltage level is reduced, any clock signals dependent on the particular power supply voltage level may operate at a lower frequency. When the power supply voltage level increases, the frequency of the clock signal also increases. Because the clock frequencies may vary as a function of power supply voltage levels, conventional synchronization techniques that rely on a fixed relationship between different clock domains cannot be relied on for transmitting signals between clock domains where at least one of the clocks has a variable frequency.

Although, clock frequencies may vary in response to varying power supply voltage levels, the techniques described herein may also be applied to situations for which the clock frequencies vary for other reasons. For example, clock frequencies may vary as temperature varies or may vary as a result of programming.

With respect to the present description, a first clock domain is a clock domain of any type of system from which a signal may be sampled. For example, the first clock domain could be a clock domain of a central processing unit (CPU), a graphics processing unit (GPU), a memory controller, and/or any other system with a clock domain. The first clock domain may include a first clock signal having a particular frequency or a frequency that may vary. A second clock domain may include a second clock signal having a particular frequency or a frequency that may vary. Signals that are transmitted from the second domain to the first domain are synchronized to the first clock domain.

Rather that using a conventional synchronizer that passes signals between clock domains using asynchronous first-in, first-out buffers (FIFOs), a low latency synchronizer may be may be designed that uses the relative phase between the two clock domains. Assuming that the first clock signal is in a receiving clock domain and the second clock signal is in a transmitting clock domain, the relative phase is used to determine when signals in the transmitting clock domain may be sampled by in the receiving clock domain. A high-resolution phase detector, described further herein, may be configured to track frequency transients and generate the relative phase and period between the two clock domains when one or both clock signals have varying frequencies. The high-resolution phase detector uses the first clock signal that is the local or receiving clock (clkr) and accepts the second clock signal from the transmitting clock domain (clkt). The high-resolution phase detector outputs two signals that encode: a phase value (Phase) and a period value (Period). The phase value represents the time, in clkr unit intervals (UI), from the last transition on clkt to the last transition on clkr. The period value represents the time, in clkr UI, between the last two transitions on clkt.

FIG. 1A illustrates a flowchart of a method 100 for locating an edge indication within a sequence of clock signal samples, in accordance with one embodiment. At step 105, a set of delayed versions of the first clock signal is generated. Each delayed version of the first clock signal is a different phase of the first clock signal. At step 110, the second clock signal is sampled using the set delayed versions of the first clock signal to produce a sequence of samples in the first clock domain. Then, at step 115, at least one edge indication is located within the sequence of samples. The edge indication is a rising or falling transition of a sample of the sequence of samples. The at least one edge indication may be used to compute the phase and period values.

Figure 1B:
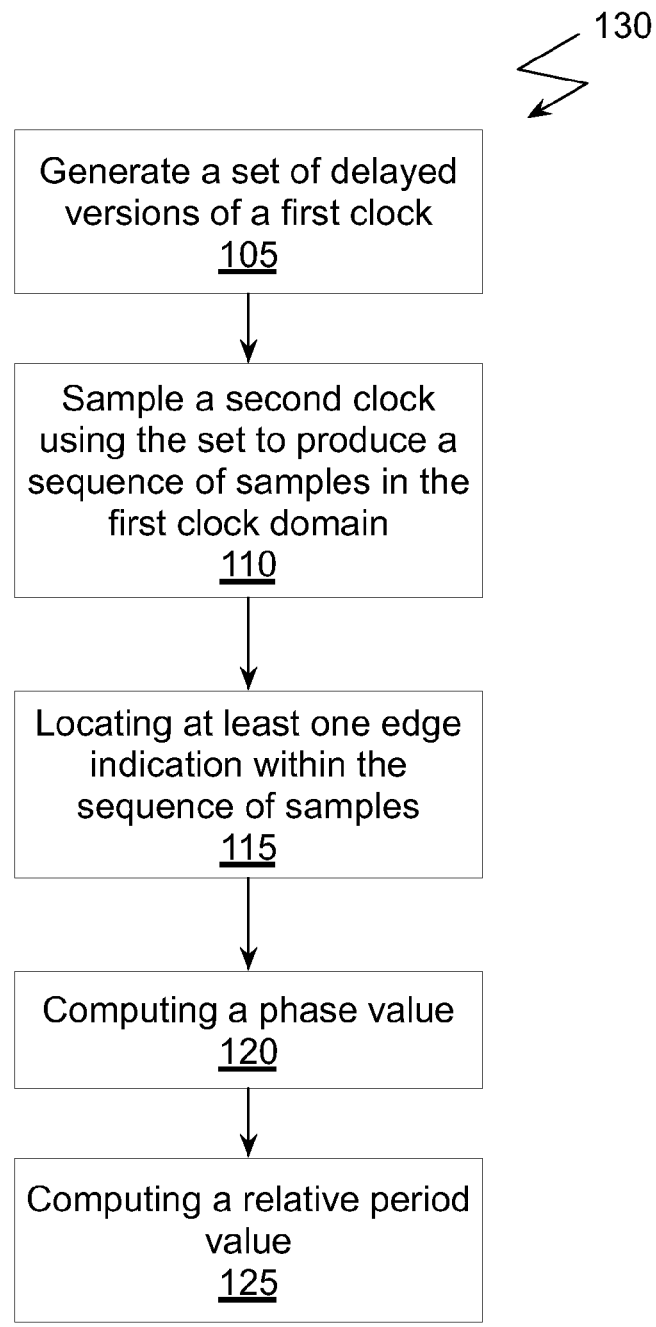
FIG. 1B illustrates a flowchart of a method for using the edge indication to detect a phase, in accordance with one embodiment.

FIG. 1B illustrates a flowchart of a method 130 for using the edge indication to detect a phase, in accordance with one embodiment. Steps 105, 110, and 115 are completed to provide at least one edge indication. At step 120, the most recent edge indication is processed to compute a phase value representing a phase of the second clock signal relative to the first clock signal. At step 125, the two most recent edge indications are processed to compute a period value representing a relative period between the second clock signal and the first clock signal.

Figure 2A:
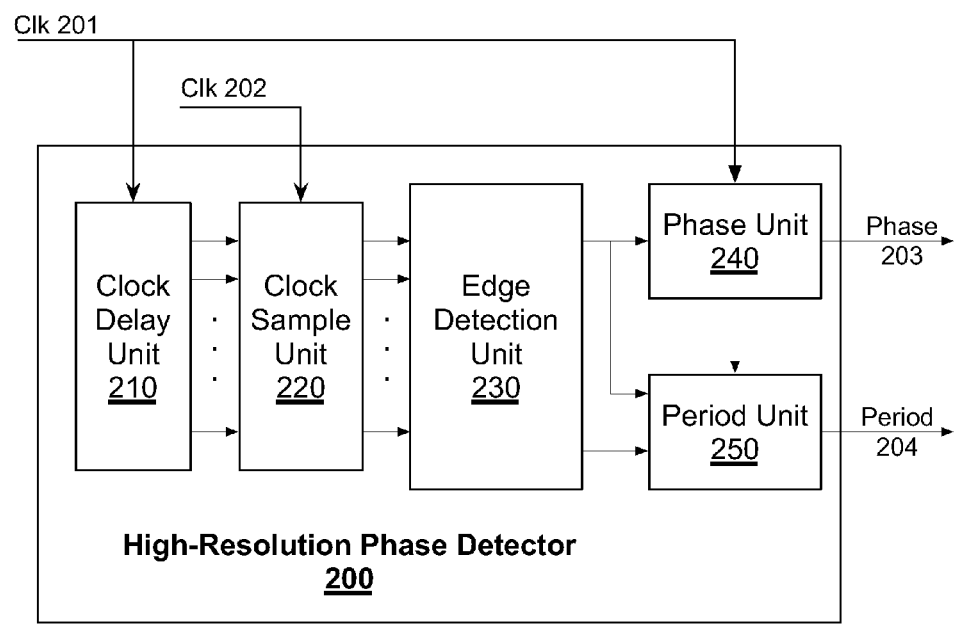
FIG. 2A illustrates a high-resolution phase detector, in accordance with one embodiment.

FIG. 2A illustrates a high-resolution phase detector 200, in accordance with one embodiment. The high-resolution phase detector 200 includes a clock delay unit 210, a clock sample unit 220, an edge detection unit 230, a phase unit 240, and a period unit 250. The high-resolution phase detector 200 receives a first clock signal, Clk 201, and a second clock signal, Clk 202, and generates two values, a phase 203 and a period 204. The phase 203 and period 204 values are each encoded by multi-bit signals. The value of phase 203 represents a phase of the second clock relative to the first clock. The value of period 204 represents a relative period between the second clock and the first clock. At least one of the first clock and the second clock may vary over time. The high-resolution phase detector 200 is designed to continuously measure the phase and period as the frequency of the first clock and/or the second clock varies.

Figure 2B:
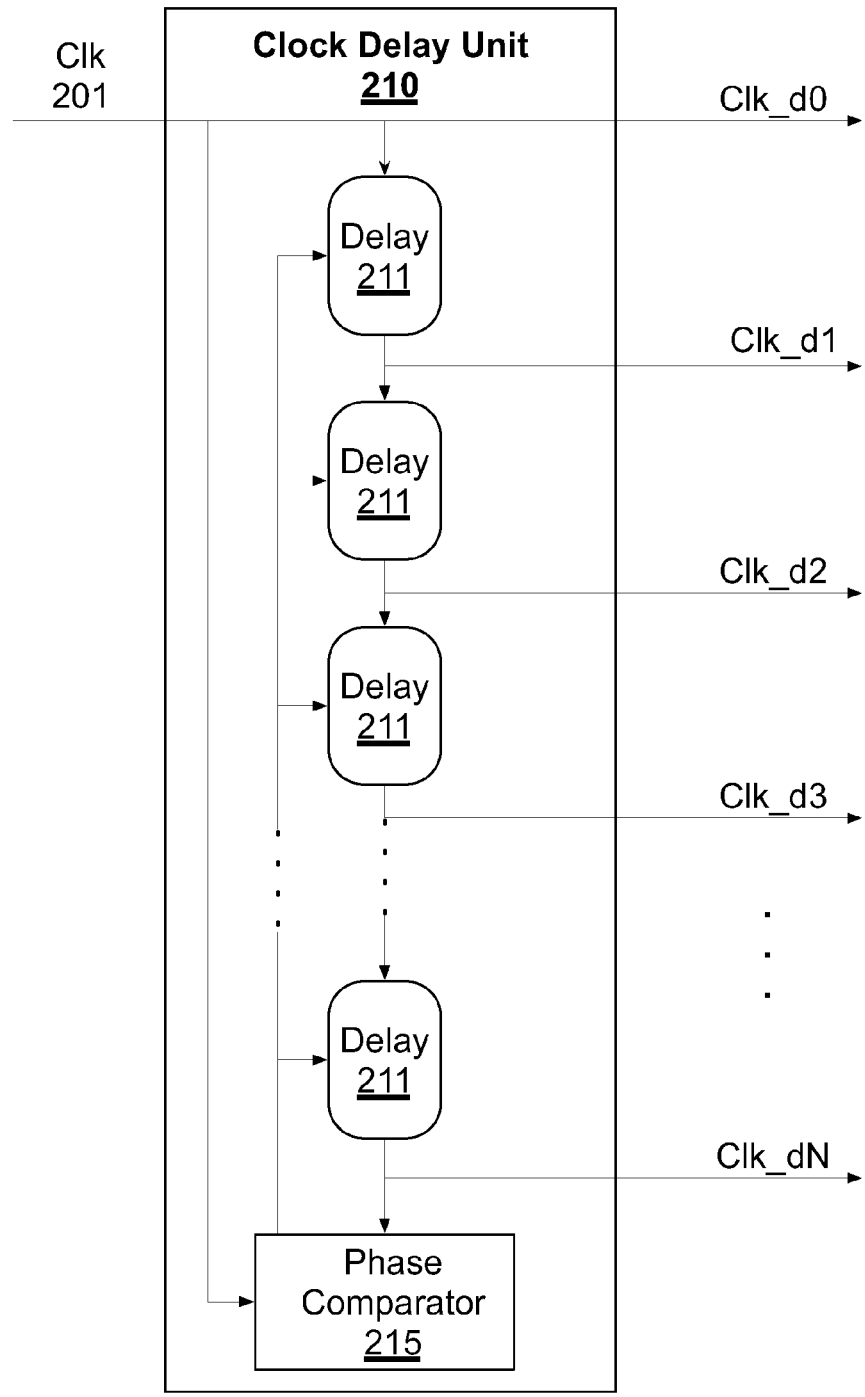
FIG. 2B illustrates a clock delay unit of FIG. 2A, in accordance with one embodiment.

FIG. 2B illustrates the clock delay unit 210 of FIG. 2A, in accordance with one embodiment. A series of N delay elements 211 produces N evenly-spaced different clock phases, delayed versions of Clk 201, specifically Clk_d0, Clk_d1, Clk_d2, Clk_d3, . . . Clk_dN. A phase comparator 215 configures the delay by which the delay elements 211 delay the respective input signals (Clk 201 and delayed versions of Clk 201) to ensure the clock phases span one period of the Clk 201, i.e., so that Clk 201=Clk_d0 has the same phase as Clk_dN. Because the phase comparator 215 controls the delay introduced by the delays elements 211, the clock delay unit 210 is a closed loop delay circuit. The resolution of the high-resolution phase detector 200 may be increased by increasing the number of delayed versions of Clk 201 generated by the clock delay unit 210.

Figure 2C:
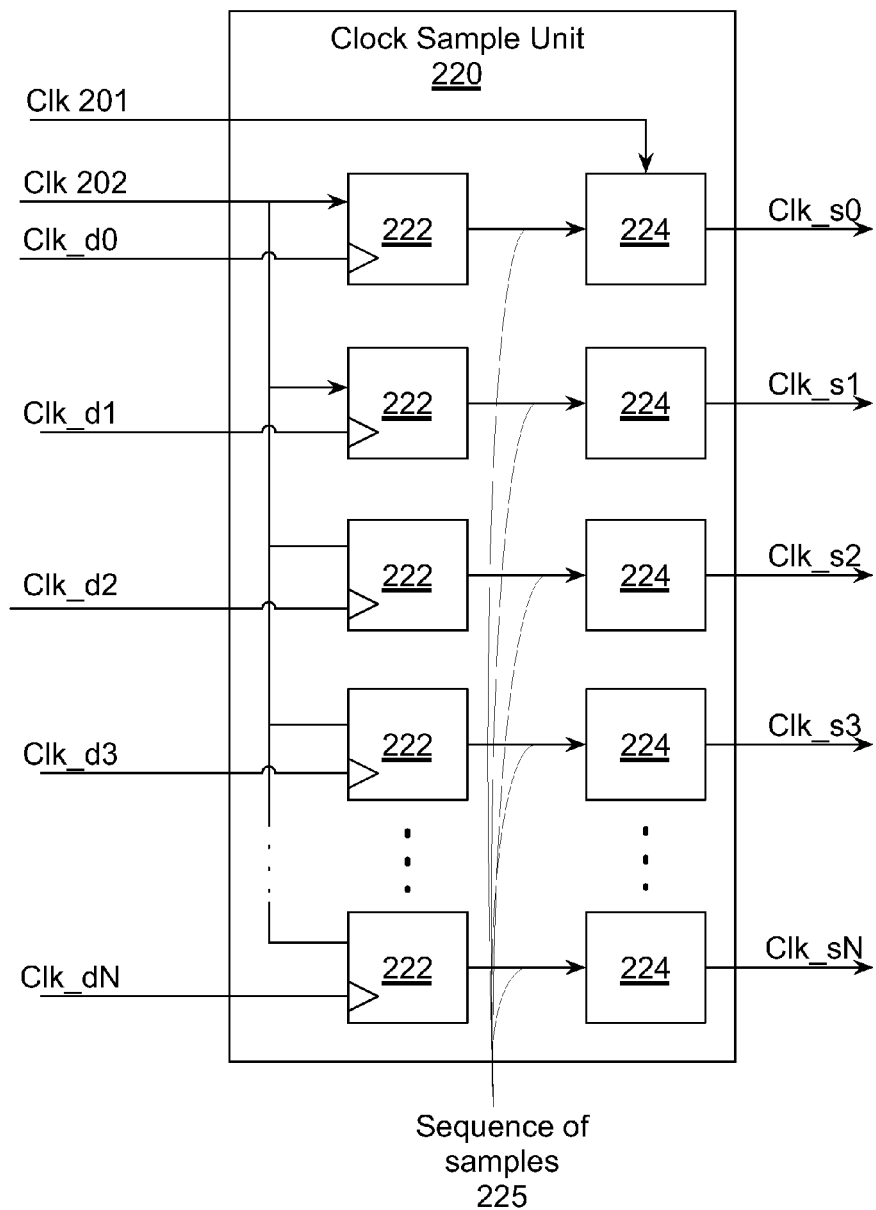
FIG. 2C illustrates a clock sample unit of FIG. 2A, in accordance with one embodiment.

FIG. 2C illustrates the clock sample unit 220 of FIG. 2A, in accordance with one embodiment. The clock sample unit 220 includes a plurality of flip-flops 222 and a corresponding plurality of synchronizers 224. The clock sample unit 220 receives the delayed versions of Clk 201 generated by the clock delay unit 210 and produces a sequence of samples of the second clock signal, Clk 202, in the domain of Clk 201. Each delayed version of the Clk 201, Clk_d0, Clk_d1, . . . Clk_dN is used to sample Clk 202, producing the sequence of samples 225 at the outputs of the flip-flops 222. The samples 225 are then retimed (to align the samples 225 with Clk 201) and synchronized (because the Clk 202 is an asynchronous signal) by the synchronizers 224 to produce the sequence of samples of Clk 202, Clk_s0, Clk_s1, Clk_s2, Clk_s3, . . . Clk_sN. The synchronizers 224 typically include one or more flip-flops, an amount that is high enough to achieve a low probability of synchronization failure. For example, 4 or 5 flip-flops in series results in a failure probability of less than $10^{-40}$.

Figure 2D:
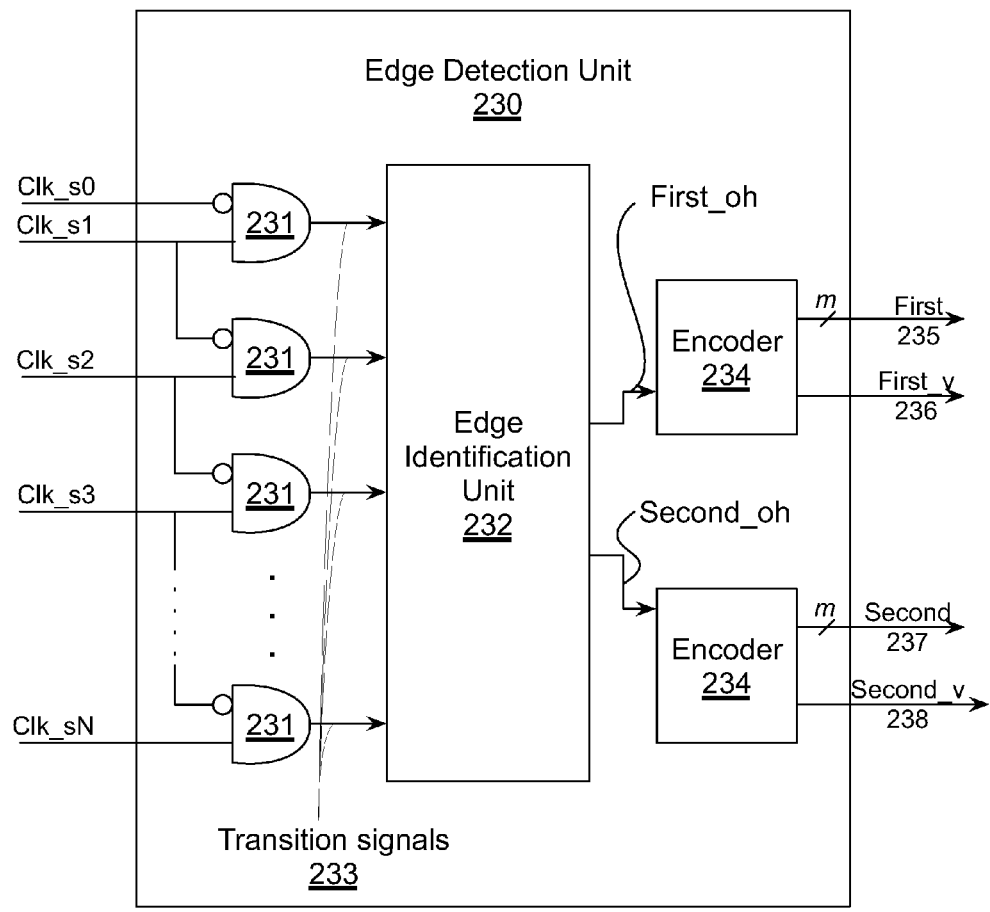
FIG. 2D illustrates an edge detection unit of FIG. 2A, in accordance with one embodiment.

FIG. 2D illustrates the edge detection unit 230 of FIG. 2A, in accordance with one embodiment. The edge detection unit 230 includes an array of AND gates 231, an edge identification unit 232, and a plurality of encoders 234. The edge detection unit 230 receives the sequence of samples Clk_s0, Clk_s1, . . . Clk_sN produced by the clock sample unit 220. The sequence of samples Clk_s0, Clk_s1, . . . Clk_sN are input to an array of AND gates 231 to locate edge indications, e.g., rising transitions within the sequence of samples. In other words, the array of AND gates 231 detect rising edges of the second clock signal, Clk 202 sampled by the first clock signal, Clk 201. In one embodiment, the edge detection unit 230 may be configured to locate edge indications that are falling transitions or both falling and rising transitions.

One or more bits of the transition signals 233, $t_i$=Clk_$s_i$ & ~Clk_$s_{i-1}$ are true if a rising edge of the Clk 202 occurred between delayed versions of the Clk 201, Clk_$d_{i-1}$ and Clk_$d_i$, where i ranges from 0 to N. For example, when a rising edge of Clk 202 occurs between Clk_d3 and Clk_d4 and a falling edge of Clk 202 occurs between Clk_d7 and Clk d8, the Clk_$s_i$ signals are 000011110 and the transition signals 233 encode the value 000010001 for i ranging 0 to N=8. The transition signals 233, $t_i$, are input to an edge identification unit 232 that finds the first bit that is true and the second bit that is true (starting from $t_N$) in the sequence of transition signals 233—if any of the bits are true. A one-hot encoding of the first bit that is true and the second bit that is true are output on signals first_oh and second_oh that are in turn encoded by the encoders 234 into m=$\log_2$(N)-bit binary signals first 235 and second 237. The transition signals 233 and/or the first_oh and second_oh signals maybe considered as edge indications. The first 235 and the second 237 values are encoded as signals and indicate the locations of the edge indications, as a number of bit positions from $t_N$ where the first and second transitions occurred respectively. For example, when the transition signals 233 encode the value 000010001, the values of first 235 and second 237, respectively are 000000001 and 000010000. Signals encode the values first_v 236 and second_v 238 that are also produced by the encoders 234 to indicate if a first and second transition were found, respectively.

Figure 2E:
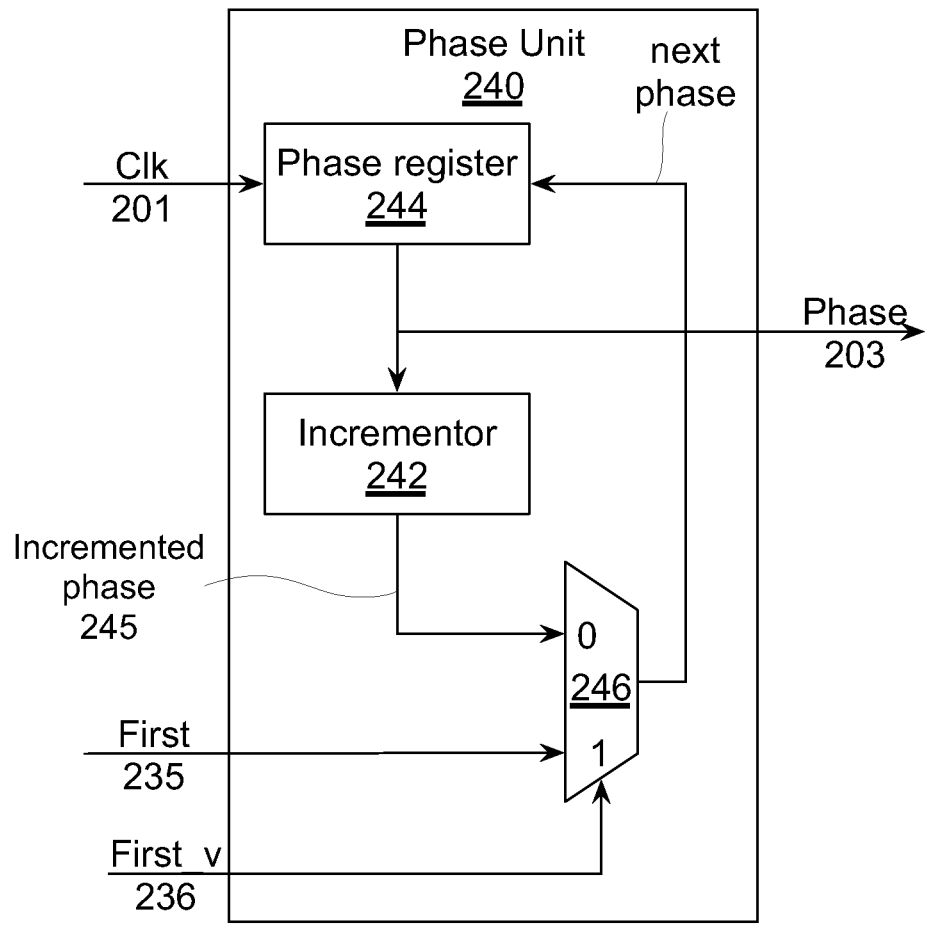
FIG. 2E illustrates a phase unit of FIG. 2A, in accordance with one embodiment.

FIG. 2E illustrates the phase unit 240 of FIG. 2A, in accordance with one embodiment. The phase unit 240 receives the values first 235 and first_v 236 from the edge detection unit 230 and generates the phase 203 value. The phase unit 240 includes a phase register 244, an incrementor 242, and a multiplexor 246. If a transition is detected, e.g., first_v 236 is asserted (is True) and first 235 equals the phase value. First 235 is a measure (in units of time) from the rising edge of Clk 201 to the most recent transition of the Clk 202. When first_v 236 is asserted, the multiplexor 246 selects the first 235 value as the output, next phase. When a transition is not detected, e.g., first_v 236 is not asserted and the multiplexor 246 selects the incremented phase 245 as the next phase. The incremented phase 245 value is computed by the incrementor 242 as phase 203 incremented by ONE. The constant ONE represents one period of the Clk 201.

Figure 2F:
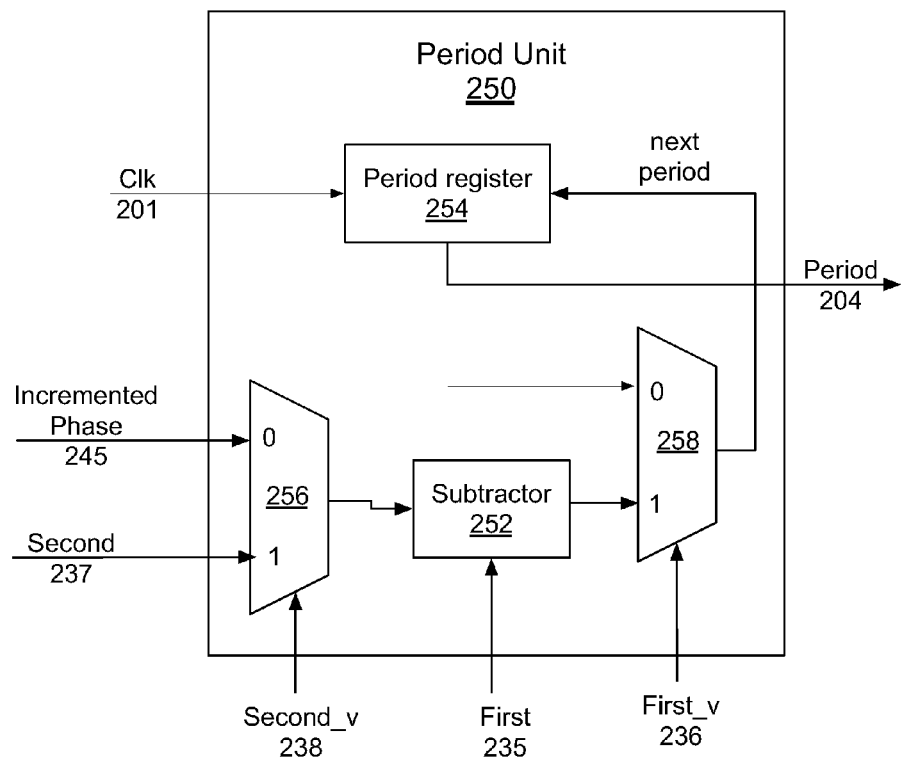
FIG. 2F illustrates a period unit of FIG. 2A, in accordance with one embodiment.

The next_phase value is input to the phase register 244 that outputs the phase 203 signal. The following Verilog may be translated to generates at a least a portion of the logic shown in the phase unit 240, in particular to provide an input (next_phase) to the phase register 244:

assign next_phase=first_v?first_phase+ONE;

FIG. 2F illustrates the period unit 250 of FIG. 2A, in accordance with one embodiment. The period unit 250 includes a period register 254, a subtractor 252, and two multiplexors 256 and 258. The period unit 250 receives first 235, first_v 236, second 237, and second_v 238 from the edge detection unit 230 and incremented phase 245 from the phase unit 240 and generates the period 204 output signal. If a second transition is detected, e.g., second_v 238 is asserted (is True) and second 235 equals the period value. If no transition is detected, e.g., neither first_v 236 nor second_v 238 is asserted, the next_period (and period 204) is unchanged. Otherwise, if two transitions are detected, e.g., first_v 236 and second_v 238 are both asserted, the next_period is computed by subtracting first 235 from the phase of the previous transition, second 237. If only one transition is detected, e.g., first_v 236 is asserted, the next_period is computed by subtracting first 235 from the phase of the previous transition, incremented phase 245. In other words, the current phase, first 235 is subtracted from the phase of the last transition— either second 237, if a second transition is detected in the same period of the Clk 201, or incremented phase 245, otherwise.

When a second transition is detected, a first transition is also detected. When second_v 238 is asserted, the multiplexor 256 selects the second 237 value as the input to the subtractor 252. When a second transition is not detected, the multiplexor 256 selects the incremented phase 245 as the input to the subtractor 252. The subtractor subtracts the first 235 value from the input to generate an output. When a first transition is detected, the multiplextor 258 selects the output of the subtractor 252 as the next period. Otherwise, the multiplextor 258 selects the output of the period register 254 as the next period and the period 204 value is unchanged.

The following Verilog may be translated to generates at a least a portion of the logic shown in the period unit 250, in particular to provide an input (next_period) to the period register 254:

assign next_period=first_v?(second_v?second:
(phase+'ONE))−first):period;

The next_period value is input to the period register 254 that outputs the period 204 signal.

In one embodiment, when Clk 201 is 10 Hz and delay elements 211 can be trimmed across process-voltage-temperature variations (PVT) to 62.5 ns, N=16 and m=4, and the constant ONE is 010000. When the value of N is a power of 2 the calculations performed by the edge detection unit 230 are simplified. The phase 203 and period 204 are represented in a fixed-point notation with m bits to the right of the binary point. The phase register 244 and period register 254 need to include sufficient bits to encode the largest possible period of Clk 202. For example, if the slowest possible Clk 202 has a period that is 5 times longer than the period of Clk 201, then three bits to the left of the binary point are required.

Because of the delay required for retiming and synchronization the values of phase 203 and period 204 reflect the phase and period of Clk 201 a fixed number of Clk 202 cycles in the past. For example when the synchronizers 224 have a delay of four cycles and a retiming delay of one cycle is introduced by the flip-flops 222, the phase 203 and period 204 values represent the state of Clk 202 five Clk 201 cycles in the past. A fast synchronizer design that uses period 204 (and possibly derivatives of period 204) to predict the phase of Clk 202 on the next cycle of Clk 201—predicts forward six cycles of Clk 201.

Figure 3A:
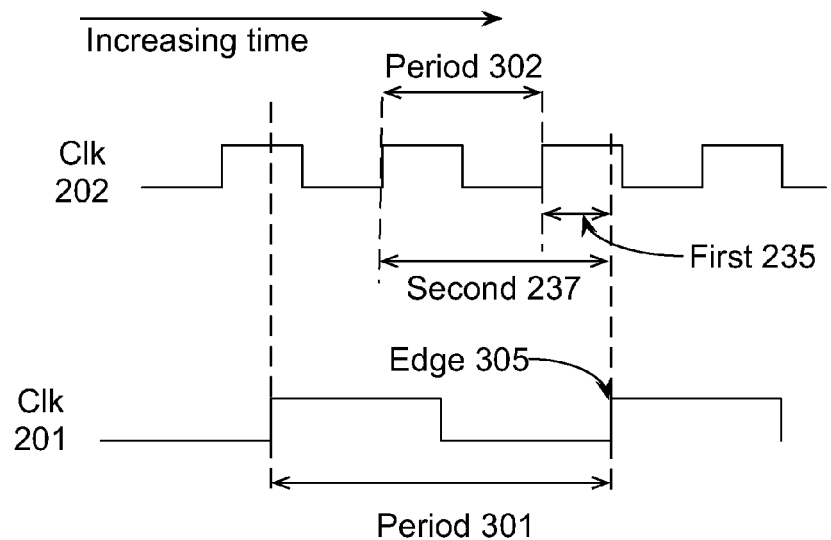
FIG. 3A illustrates waveforms of two clock signals, in accordance with one embodiment.

FIG. 3A illustrates waveforms of two clock signals, Clk 201 and Clk 202, in accordance with one embodiment. The frequency of the second clock, Clk 202 is faster than the frequency of the first clock, Clk 201. Signals are transmitted from a second clock domain corresponding to the Clk 202 to a first clock domain corresponding to the Clk 201. As shown, the period 302 of the Clk 202 is shorter than the period 301 of the Clk 201. Therefore, at least one edge indication for the Clk 202 should be detected within each clock period 301 by the edge detection unit 230. As shown, two edges of the Clk 202 occur within the period 301. At most recent edge 305 of clock 201, the first 235 value corresponding to a first edge indication within the period 301 is computed by the edge detection unit 230. At the most recent edge 305 of the clock 201, the second 237 value corresponding to a second edge indication within the period 301 is also computed by the edge detection unit 230.

In one embodiment, the edge detection unit 230 is configured to compute a third value corresponding to a third edge indication. The third value may be used to compute a slope of the relative period when at least one of the Clk 201 and the Clk 202 is changing smoothly. The slope may by used by a synchronization unit to predict a more accurate value of the future phase and future period. Predicting the values of the phase 203 and period 204 one or more clocks ahead is useful because the current phase 203 and period 204 are valid for several clock cycles of the Clk 201 in the past due to the latency of the high-frequency phase detector 200.

Figure 3B:
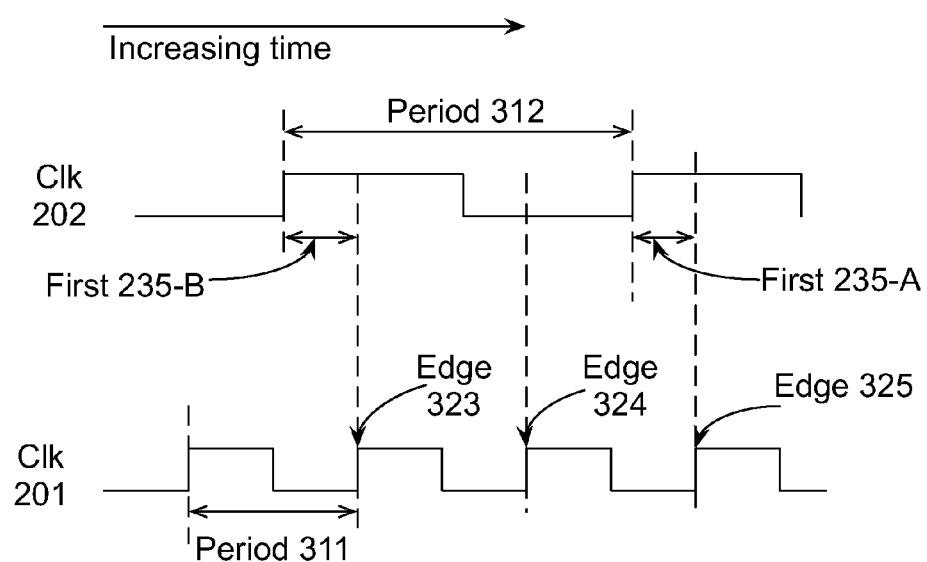
FIG. 3B illustrates other waveforms of two clock signals, in accordance with one embodiment.

FIG. 3B illustrates another example of waveforms of the two clock signals, Clk 201 and Clk 202, in accordance with one embodiment. The frequency of the transmitting clock, Clk 202 is slower than the frequency of the receiving clock, Clk 201. As shown, the period 312 of the Clk 202 is longer than the period 311 of the Clk 201. Therefore, during some periods of the Clk 201 an edge indication for the Clk 202 may not be detected by the edge detection unit 230.

At an oldest edge 323, the first 310 value corresponding to a first edge indication at the start of period 312 is located by the edge detection unit 230 and the first 235-B value is computed by the edge detection unit 230. In this example assume that the first 235-B value equals 7 units of the delay 211. Therefore, the next phase is set to 7 by the phase unit 240 and the next period is computed as the difference between phase 203 summed with N=16 and first 310. The phase 203 and period 204 are updated at the clock edge 324. At a next edge 324, no edge indication is located by the edge detection unit 230 and, the next phase is updated by the phase unit 240 as the phase 203 increased by N=16 so that the phase 203 is updated to 7+16=23. The period 204 is unchanged.

At a most recent edge 325, the first 235-A value corresponding to another first edge indication at the end of the period 312 is located by the edge detection unit 230 and the first 235-A value is computed by the edge detection unit 230. In this example assume that this additional first 235-A value equals 6 units of the delay 211. Therefore, the next phase is set to 6 by the phase unit 240 and the next period is computed as the difference between phase 203 summed with N=16 and first 235-A, i.e., 23+16−6=33. The phase 203 and period 204 are updated at the clock edge 325.

Figure 4:
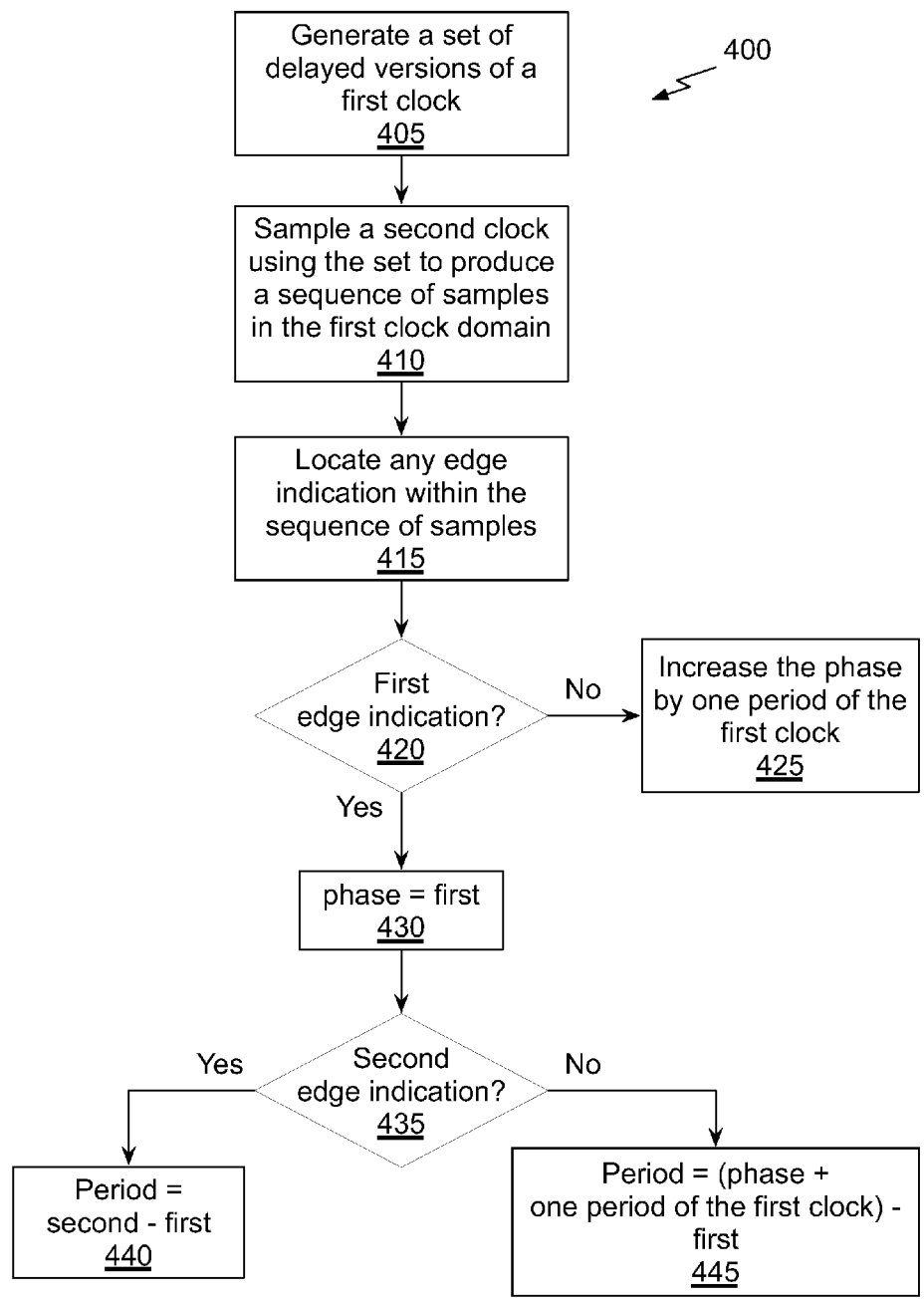
FIG. 4 illustrates a flowchart of a method for determining a phase and a period, in accordance with one embodiment.

FIG. 4 illustrates a flowchart of a method 400 for determining the phase 203 and period 204, in accordance with one embodiment. At step 405, a set of delayed versions of the Clk 201 is generated by the clock delay unit 210. At step 410, the Clk 202 is sampled by the clock sample unit 220 using the set delayed versions of the Clk 201 to produce the sequence of samples 225 in the domain of the Clk 201. Then, at step 415, the edge detection unit 230 locates any edges, e.g., rising, falling, or rising and falling, within the sequence of samples 225.

At step 420, the phase unit 240 determines if a first edge indication was detected by the edge detection unit 230, and, if not, at step 425 the phase 203 is updated to the phase 203 increased by one period of Clk 201, e.g., phase+ONE. When first edge indication is not detected by the edge detection unit 230, the period 204 is not changed. Otherwise, when a first edge indication is detected, at step 430 the phase unit 240 sets the phase 203 equal to the first 235 signal generated by the edge detection unit 230. At step 435, the period unit 250 determines if a second edge indication is detected by the edge detection unit 230, and, if so, the at step 440 the period unit 250 sets the period 204 equal to the second 237 signal. Otherwise, at step 445, the period unit 250 updates the period 204 to the difference between the sum of the phase 203 and one period of the Clk 201 and the first 235 signal.

Figure 5A:
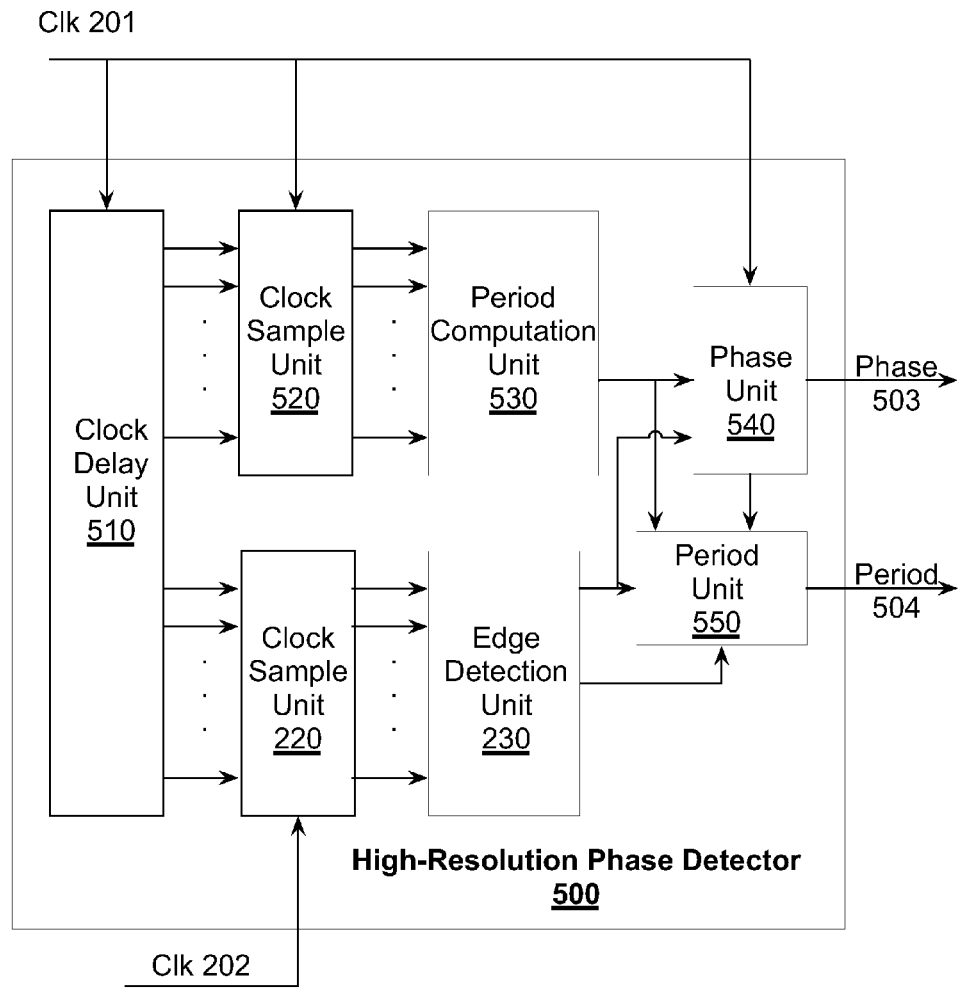
FIG. 5A illustrates another high-resolution phase detector, in accordance with one embodiment.

FIG. 5A illustrates a high-resolution phase detector 500, in accordance with one embodiment. The high-resolution phase detector 500 includes an open-loop clock delay unit 510, the clock sample unit 220, a clock sample unit 520, the edge detection unit 230, a period computation unit 530, a phase unit 540, and a period unit 550. The high-resolution phase detector 500 receives a first clock, Clk 201, and a second clock, Clk 202, and generates two values, a phase 503 and a period 504.

Figure 5B:
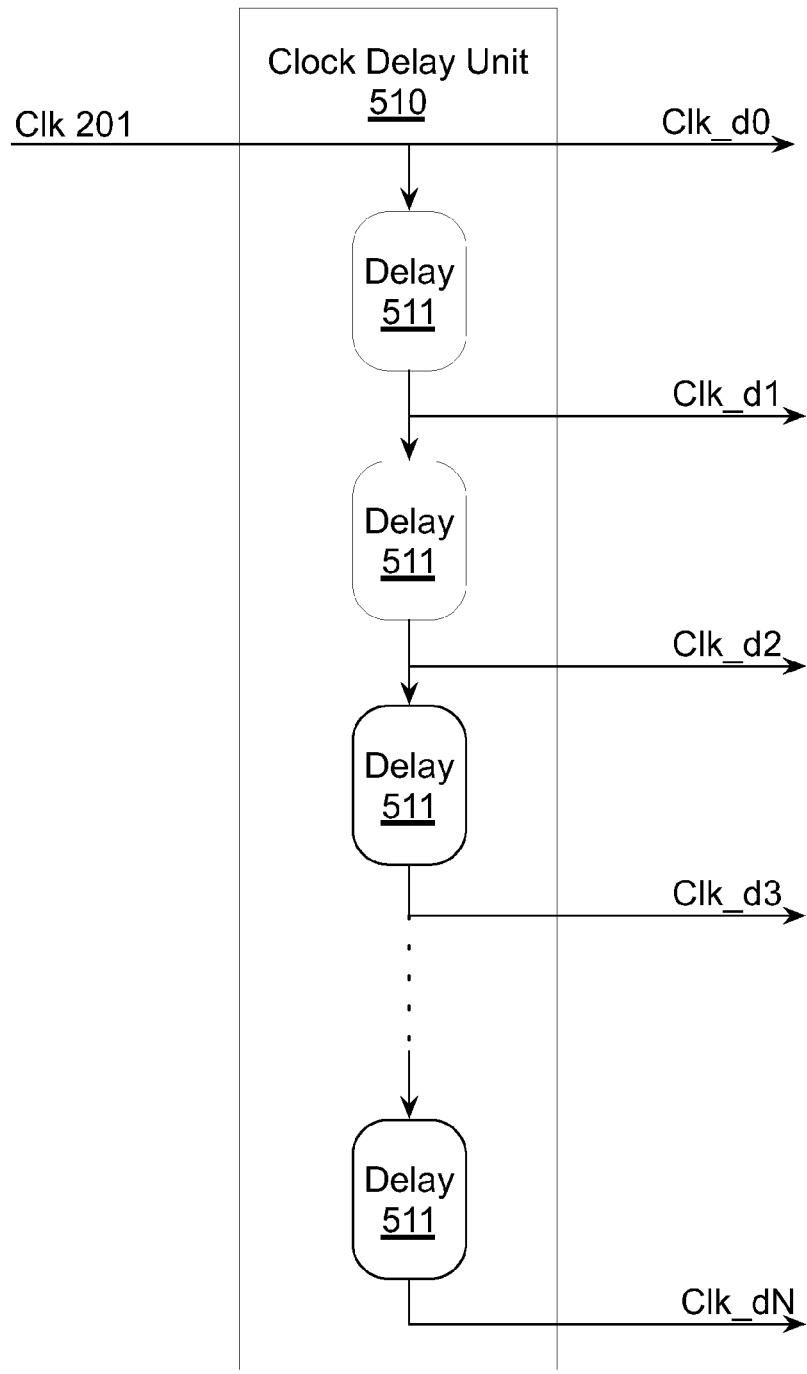
FIG. 5B illustrates an open-loop clock delay unit of FIG. 5A, in accordance with one embodiment.

FIG. 5B illustrates the open-loop clock delay unit 510 of FIG. 5A, in accordance with one embodiment. The open-loop clock delay unit 520 replaces the clock delay unit 210 in the high-resolution phase detector 500 compared with the high-resolution phase detector 200. A series of N delay elements 511 produces N clock phases, e.g., delayed versions of Clk 202, specifically Clk_d0, Clk_d1, Clk_d2, Clk_d3, . . . Clk_dN. Unlike the clock delay unit 210, the N clock phases are not necessarily evenly spaced because the open-loop clock delay unit 520 does not include a phase comparator 215 to control the amount by which each of the delay elements 511 delays the Clk 202 to generate the delayed versions of the Clk 202. The number of delay elements 511 should be high enough so that at least one period of the Clk 202 is sampled.

Figure 5C:
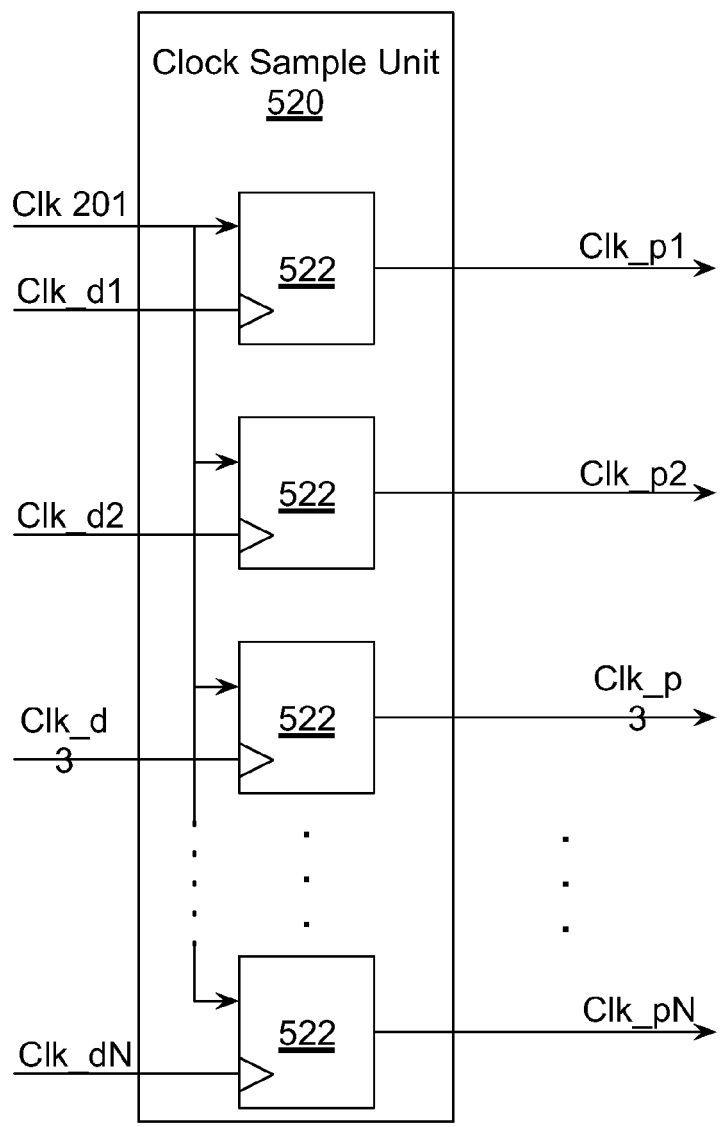
FIG. 5C illustrates a clock sample unit of FIG. 5A, in accordance with one embodiment.

FIG. 5C illustrates the clock sample unit 520 of FIG. 5A, in accordance with one embodiment. The clock sample unit 520 includes a plurality of flip-flops 522. The clock sample unit 520 receives the delayed versions of Clk 201 generated by the clock delay unit 210 and produces a sequence of samples of the first clock signal, Clk 201. Sampling the first clock signal is performed to compute the period of the Clk 201 in units of the delay introduced by one delay element 511. Each clock phase, Clk_d0, Clk_d1, . . . Clk_dN is used to sample Clk 201, producing the sequence of first clock samples at the outputs of the flip-flops 522, e.g., Clk_p1, Clk_p2, Clk_p3, . . . Clk_pN.

Figure 5D:
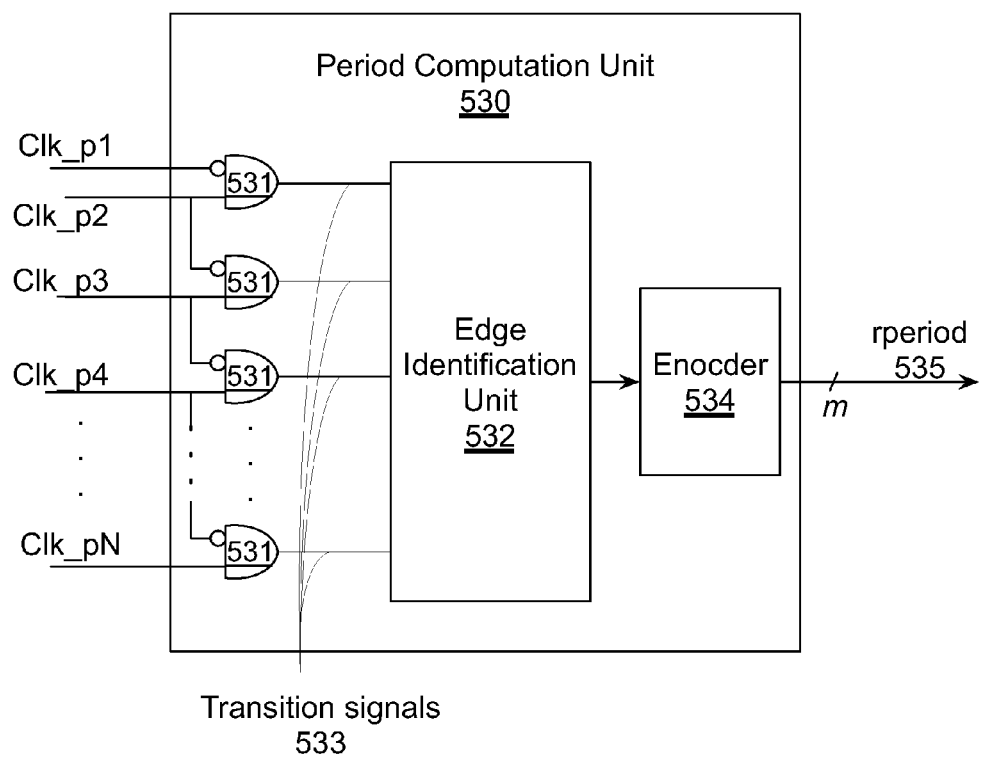
FIG. 5D illustrates a period computation unit of FIG. 5A, in accordance with one embodiment.

FIG. 5D illustrates the period computation unit 530 of FIG. 5A, in accordance with one embodiment. The period computation unit 530 includes an array of AND gates 531, an edge identification unit 532, and an encoder 534. The period computation unit 530 receives the sequence of first clock samples Clk_p1, Clk_p2, . . . Clk_pN produced by the clock sample unit 520. The sequence of first clock samples Clk_p1, Clk_p2, . . . Clk_pN are input to the array of AND gates 531 to locate rising transitions, e.g., edges, within the sequence of first clock samples. In other words, the AND gates 531 detect rising edges of the first clock signal 201 sampled by delayed versions of the first clock signal 201. The AND gates 531 generate transition signals 533 that may be used to compute the period of the Clk 201. The AND gates 531 receiving at least one of Clk_p1 and Clk_p2 may be ignored by the edge identification unit 532 to ensure that metastable signals are not sampled. In one embodiment, the period computation unit 530 may be configured to locate falling transitions or both falling and rising transitions.

One or more bits of the transition signals 533, $t_i$=Clk_$p_i$ & ~Clk_$p_{i-1}$ are true if a rising edge of the Clk 201 occurred between delayed versions of the Clk 201, Clk_$d_{i-1}$ and Clk_$d_i$, where i ranges from 0 to N. The transition signals 533, $t_i$, are input to the edge identification unit 532 that finds the first one (where one is a bit that is true) in the sequence of transition signals 533. The binary encoding of the position at which the first edge is detected is rperiod 535—the period of Clk 301 in units of the delay of one delay 511.

Figure 5E:
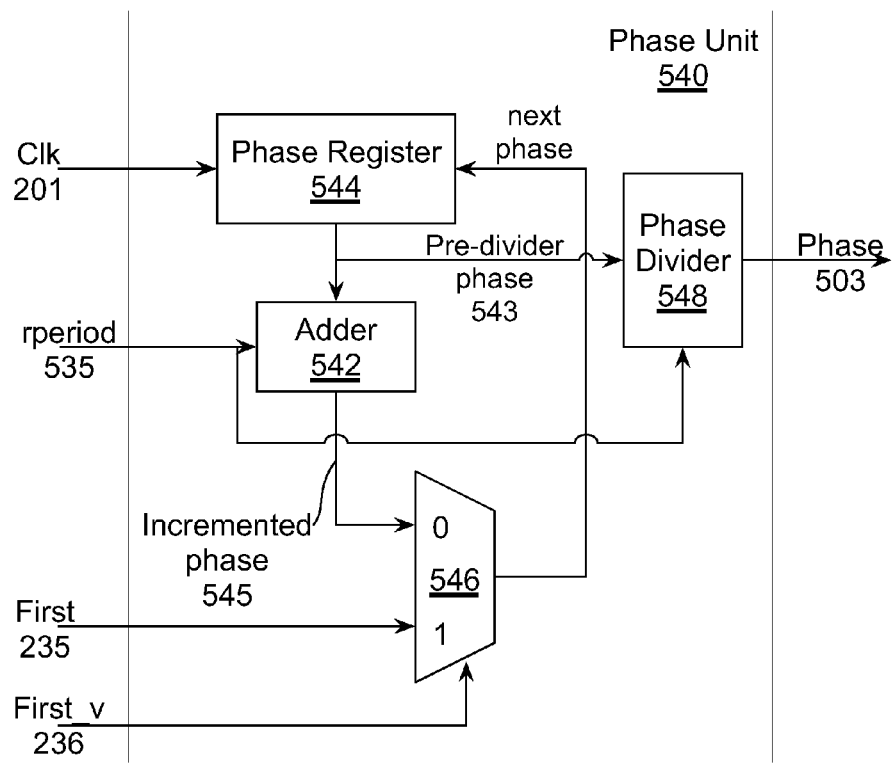
FIG. 5E illustrates a phase unit of FIG. 5A, in accordance with one embodiment.

FIG. 5E illustrates the phase unit 540 of FIG. 5A, in accordance with one embodiment. The phase unit 540 includes a phase register 544, an adder 542, a multiplexor 546, and a phase divider 548. The phase unit 540 receives first 235 and first_v 236 from the edge detection unit 230 and rperiod 535 from the period computation unit 530 and generates the phase 503 output signal. The value rperiod 535 is used in the phase unit 540 in place of the constant ONE in the phase unit 240. Also, the value of phase produced by the phase unit 540 is divided by rperiod 535 for use by a fast periodic synchronizer.

First 235 is a measure (in units of time) from the rising edge of Clk 201 to the most recent transition of the Clk 202. If a transition is detected, e.g., first_v 236 is asserted, first 235 gives the phase value. When first_v 236 is asserted, the multiplexor 546 selects the first 235 value as the output, next phase. When a transition is not detected, e.g., first_v 236 is not asserted, the multiplexor 546 selects incremented phase 545 as the next phase. The incremented phase 545 value is computed by the adder 542 as the pre-divider phase incremented by rperiod 535.

The next_phase value is input to the phase register 544 that outputs the pre-divider phase signal. The following Verilog may be translated to generates at least a portion of the logic shown in the phase unit 540, in particular to provide an input (next_phase) to the phase register 544:

assign next_phase=first_v?first:predivider_phase+rperiod;

The output of the phase register 544, e.g., pre-divider phase, is divided by rperiod 535 within the phase divider 548 to produce the phase 503 value.

Figure 5F:
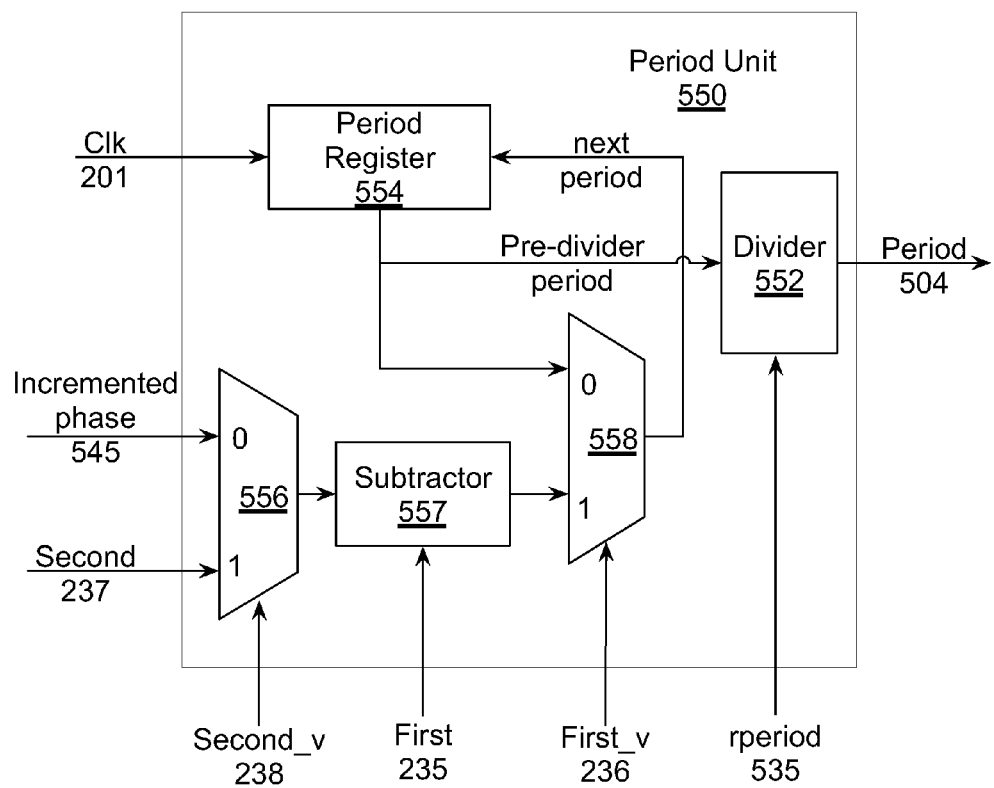
FIG. 5F illustrates a period unit of FIG. 5A, in accordance with one embodiment.

FIG. 5F illustrates the period unit 550 of FIG. 5A, in accordance with one embodiment. The period unit 550 includes a period register 554, a subtractor 557, two multiplexor 556, multiplexor 558, and a divider 552. The period unit 550 receives first 235, first_v 236, second 237, and second_v 238 from the edge detection unit 230, rperiod 535 from the period computation unit 530, and incremented phase 545 from the phase unit 540 and generates the period 504 output signal.

If no transition is detected, e.g., neither first_v 236 nor second_v 238 is asserted, the next_period (and period 504) is unchanged. Otherwise, if two transitions are detected, e.g., first_v 236 and second_v 238 are both asserted, the next_period is computed by subtracting first 235 from the phase of the previous transition, second 237. If only one transition is detected, e.g., first_v 236 is asserted, the next_period is computed by subtracting first 235 from the phase of the previous transition, incremented phase 545. In other words, the current phase, first 235 is subtracted from the phase of the last transition—either second 237 if a second transition is detected in the same period of the Clk 201 or incremented phase 545 otherwise. The number of bits for dividers 548 and 552 is determined by the number of bits in rperiod 535, e.g., 4 bits if N=16. Note that N may be any integer value.

When a second transition is detected, a first transition is also detected. When second_v 238 is asserted, the multiplexor 556 selects the second 237 value as the input to the subtractor 557. When a second transition is not detected, the multiplexor 556 selects the incremented phase 245 as the input to the subtractor 557. The subtractor subtracts the first 235 value from the input to generate an output. When a first transition is detected, the multiplexor 558 selects the output of the subtractor 252 as the next period. Otherwise, the multiplexor 558 selects the output of the period register 554 as the next period and the period 504 value is unchanged.

The following Verilog may be translated to generate at a least a portion of the logic shown in the period unit 550, in particular to provide an input (next_period) to the period register 554:

```
assign next_period = first_v ?
  (second_v ? second : (phase+rperiod)) - first) : period ;
```

The next_period value is input to the period register 554. The output of the period register 554, e.g., pre-divider period, is divided by rperiod 535 within the period divider 552 to produce the period 504 value.

Figure 5G:
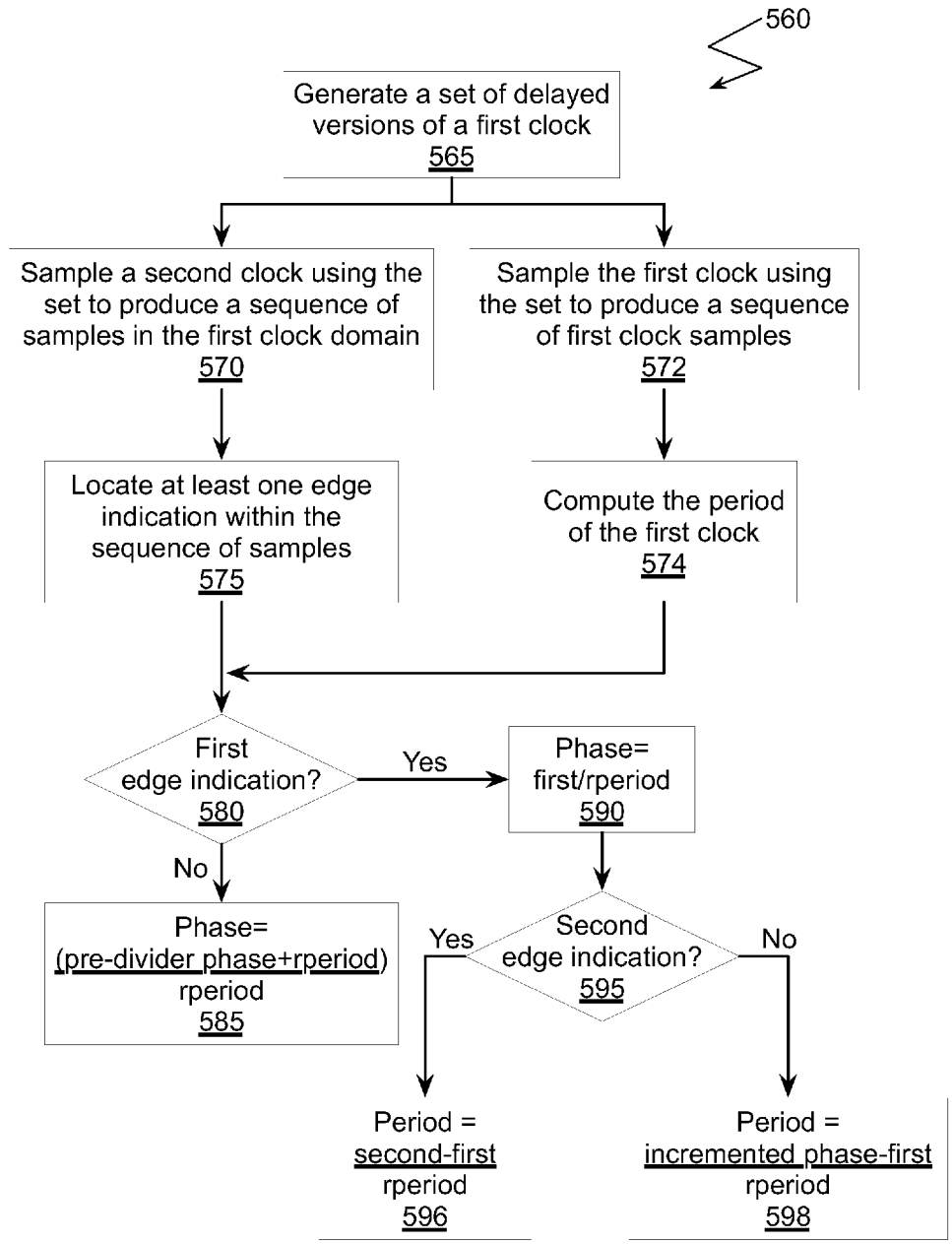
FIG. 5G illustrates another flowchart of a method for determining a phase and a period, in accordance with one embodiment.

FIG. 5G illustrates another flowchart of a method 560 for determining the phase 503 and period 504 using the open-loop high-resolution phase detector 500, in accordance with one embodiment. At step 565, a set of delayed versions of the Clk 201 is generated by the open-loop clock delay unit 510. At step 570, the Clk 202 is sampled by the clock sample unit 220 using the set delayed versions of the Clk 201 to produce the sequence of samples 225 in the domain of the Clk 201. Then, at step 575, the edge detection unit 230 locates any edges, e.g., rising, falling, or rising and falling, within the sequence of samples 225.

At step 572, the Clk 201 is sampled by the clock sample unit 520 using the set delayed versions of the Clk 201 to produce the sequence of first clock samples 525 in the domain of the Clk 201. Then, at step 574, the period computation unit 530 locates an edge, e.g., rising, falling, or rising and falling, within the sequence of first clock samples 525 and determines the rperiod 535, e.g., the period of the Clk 201. One or more of steps 572 and 574 may be performed in parallel with one or more of steps 570 and 575.

At step 580, the phase unit 540 determines if a first edge indication was detected by the edge detection unit 230, and, if not, at step 585 the phase 503 is updated to the sum of the phase 503 increased by one period of the Clk 201 and divided by one period of the Clk 201, e.g., (phase+rperiod)/rperiod.

When first edge indication is not detected by the edge detection unit 230, the period 504 is not changed. Otherwise, when a first edge indication is detected, at step 590, the phase unit 540 sets the phase 503 equal to the first 235 signal generated by the edge detection unit 230 divided by rperiod 535. At step 595, the period unit 550 determines if a second edge indication is detected by the edge detection unit 230, and, if so, then at step 598 the period unit 550 sets the period 504 equal to the second 237 signal divided by the rperiod 535. Otherwise, at step 598, the period unit 550 updates the period 504 to the difference between the sum of the phase 503 and one period of the Clk 201 and the first 235 signal divided by one period of the Clk 201 (i.e., rperiod 535).

Figure 6A:
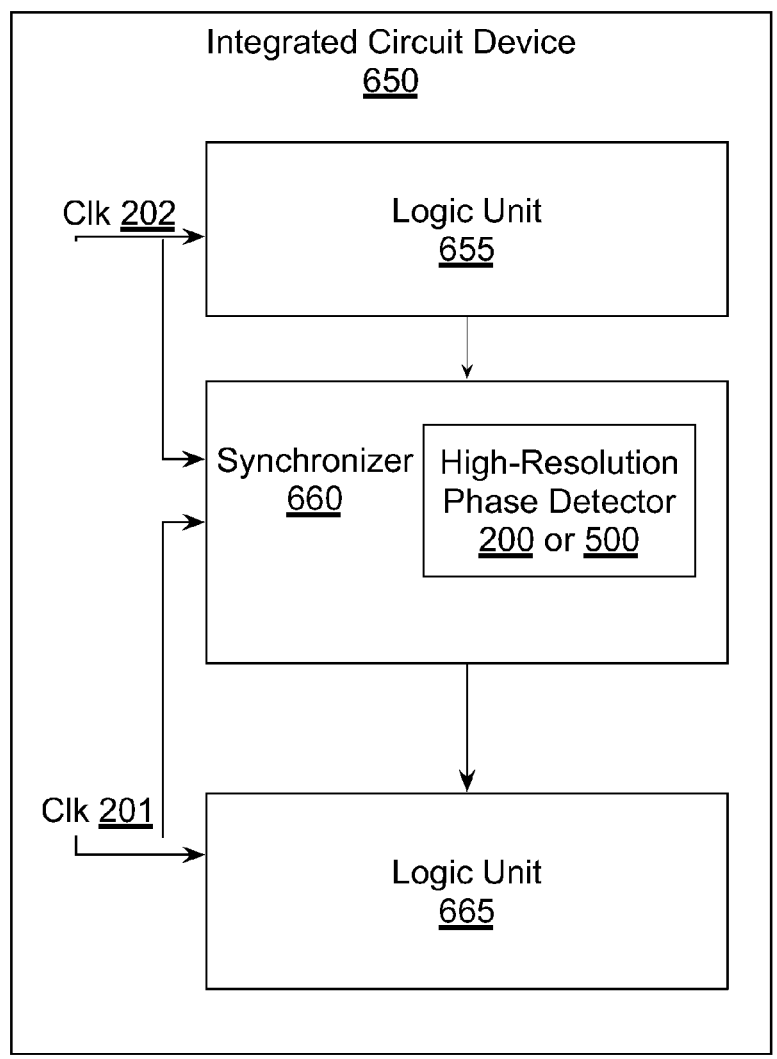
FIG. 6A illustrates an exemplary integrated circuit in which the various architecture and/or functionality of the various previous embodiments may be implemented.

FIG. 6A illustrates an exemplary integrated circuit device 650 in which the various architecture and/or functionality of the various previous embodiments may be implemented. The integrated circuit device 650 includes a logic unit 655, a synchronizer 660, and a logic unit 665. The logic unit 655 receives the clock 202 and generates outputs that are synchronous with the clock 202. The outputs are received by the synchronizer 660 and are transmitted from the clock domain of the clock 202 to the clock domain of the clock 201 using the phase 203 and period 204 values computed by the high-resolution phase detector 200 or 500. The transmitted outputs that are synchronized to the clock domain of the clock 201 are received by the logic unit 665.

Figure 6B:
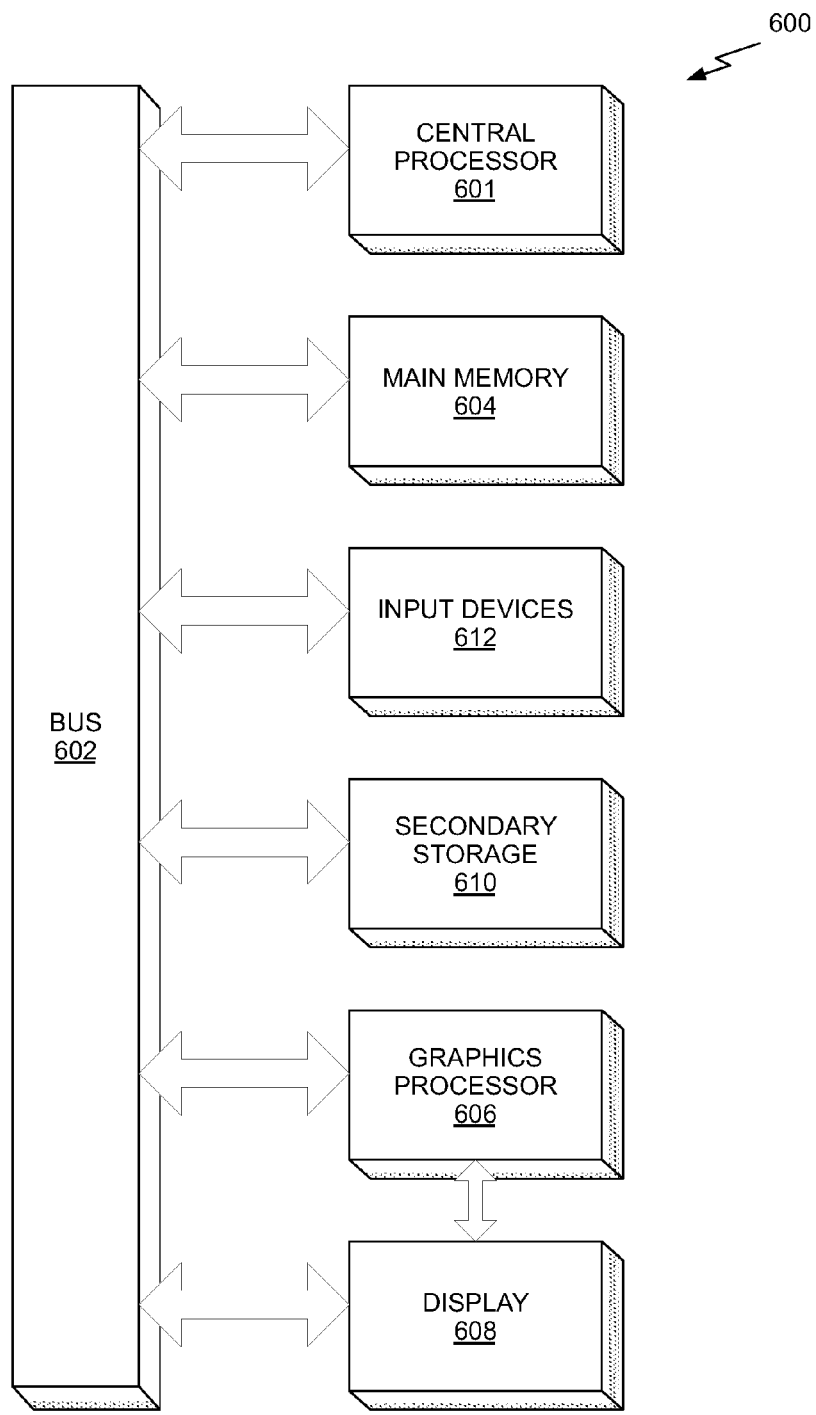
FIG. 6B illustrates an exemplary system in which the various architecture and/or functionality of the various previous embodiments may be implemented.

FIG. 6B illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. One or more of the integrated circuits shown in FIG. 6B may include the high-resolution phase detector 200 and/or 500 for transmitting signals between different clock domains.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
   generating a set of delayed versions of a first clock signal;
   sampling a second clock signal using the set of delayed versions of the first clock signal to produce a sequence of second clock samples in a domain corresponding to the first clock signal; and
   locating at least one edge indication within the sequence of second clock samples.

2. The method of claim 1, wherein the set of delayed versions of the first clock signal are generated using an open-loop delay circuit.

3. The method of claim 2, further comprising:
   sampling the first clock signal using the set of delayed versions of the first clock signal to produce a sequence of first clock samples in the domain corresponding to the first clock signal; and
   locating a first edge indication within the sequence of first clock samples.

4. The method of claim 3, further comprising computing a period of the first clock signal based on the first edge indication within the sequence of first clock samples.

5. The method of claim 1, further comprising processing the at least one edge indication to compute a phase value representing a phase of the second clock signal relative to the first clock signal.

6. The method of claim 5, wherein the at least one edge indication includes a first edge that is a most recent edge, and the processing of the at least one edge indication comprises setting a next phase value to a location of the first edge.

7. The method of claim 5, further comprising:
   generating a second set of delayed versions of the first clock signal;
   sampling the second clock signal using the second set of delayed versions of the first clock signal to produce a second sequence of second clock samples in the domain corresponding to the first clock signal; and
   computing a next phase value as the phase value increased by a number of delayed versions of the first clock signal in the second set.

8. The method of claim 1, further comprising processing the at least one edge indication to compute a period value representing a relative period between the second clock signal and the first clock signal.

9. The method of claim 8, wherein the at least one edge indication includes a first edge and a second edge, wherein the first edge is more recent than the second edge, and the processing of the at least one edge indication to compute the period value comprises setting a next period value to the difference in a location of the second edge and a location of the first edge.

10. The method of claim 8, wherein the at least one edge indication includes only a first edge, and further comprising:
    processing the at least one edge indication to compute a phase value representing a phase of the second clock signal relative to the first clock signal; and
    computing a next period value as a difference between the phase value increased by a number of delayed versions of the first clock signal in the set and the location of the first edge.

11. The method of claim 1, wherein the set of delayed versions of the first clock signal are generated using a closed delay loop circuit.

12. The method of claim 1, further comprising processing a first edge indication and a second edge indication to compute a period value representing a relative period between the second clock signal and the first clock signal.

13. The method of claim 1, wherein a frequency of the first clock signal varies over time.

14. The method of claim 1, wherein the frequency of the first clock signal varies in response to variations in a power supply voltage.

15. The method of claim 1, wherein a frequency of the second clock signal varies over time.

16. An integrated circuit comprising:
    first circuitry operating in a first clock domain corresponding to a first clock signal;
    second circuitry operating in a second clock domain corresponding to a second clock signal; and
    a phase detector configured to:
       generate a set of delayed versions of the first clock signal;
       sample the second clock signal using the set of delayed versions of the first clock signal to produce a sequence of second clock samples in a domain corresponding to the first clock signal; and
       locate at least one edge indication within the sequence of second clock samples.

17. The integrated circuit of claim 16, wherein the phase detector comprises an open-loop delay circuit that is configured to generate the set of delayed versions of the first clock signal.

18. The integrated circuit of claim 16, wherein the phase detector is further configured to further process the at least one edge indication to compute a phase value representing a phase of the second clock signal relative to the first clock signal.

19. The integrated circuit of claim 16, wherein the phase detector is further configured to process the at least one edge indication to compute a period value representing a relative period between the second clock signal and the first clock signal.

20. The integrated circuit of claim 16, wherein the phase detector comprises a closed-loop delay circuit that is configured to generate the set of delayed versions of the first clock signal.

* * * * *